United States Patent [19]
Miller

[11] Patent Number: 5,488,369
[45] Date of Patent: Jan. 30, 1996

[54] HIGH SPEED SAMPLING APPARATUS AND METHOD FOR CALIBRATING THE SAME

[75] Inventor: Allen Miller, Llandudno, United Kingdom

[73] Assignee: Gould Electronics, Ltd., London, United Kingdom

[21] Appl. No.: 220,215

[22] Filed: Jul. 15, 1988

[30]     Foreign Application Priority Data

Nov. 18, 1986 [GB]  United Kingdom ............... 8627533
Nov. 18, 1987 [WO]  WIPO ................. PCT/GB87/00817

[51] Int. Cl.⁶ ........................................... H03M 1/10
[52] U.S. Cl. ............................................ 341/122; 341/120
[58] Field of Search ................................ 341/120, 122, 341/133

[56]           References Cited
          U.S. PATENT DOCUMENTS 4,053,926  10/1977  Lemoine et al. ........................ 358/8
4,353,057  10/1982  Bernet et al. ........................ 341/122
4,763,105  8/1988   Jenq ........................ 341/159
4,768,017  8/1988   Gordon ........................ 341/122
4,833,445  5/1989   Buchele ........................ 341/118

*Primary Examiner*—Marc S. Hoff
*Attorney, Agent, or Firm*—Benesch, Friedlander, Coplan & Aronoff

[57]           ABSTRACT

A high speed sampling apparatus based on multiplexed charged coupled devices or sample and hold devices (18) utilises a microprocessor (20) to monitor timing differences between clock signals, each used to clock a respective one of the devices and a reference signal to control a variable timing delay (12, 13, 14) whereby to calibrate each of the devices (18). The control of the variable timing delay (12, 13, 14) is achieved by a digital/analogue converter (15) and additionally, a mark to space ratio control of the variable timing delay is also provided using a digital/analogue converter (16).

7 Claims, 3 Drawing Sheets

HIGH SPEED SAMPLING APPARATUS AND METHOD FOR CALIBRATING THE SAME

This is a national application which claims priority to PCT/GB87/00817, filed Nov. 18, 1987.

The present invention relates to the calibration of components used in a high speed sampling apparatus such as a digital storage oscilloscope.

Digital storage oscilloscopes capable of capturing rapid transients in analogue waveforms conventionally make use of a high speed analogue to digital (ADC) converter system. This is followed by a digital store operating at the clock rate of the ADC. The captured waveform can then be displayed at a much slower speed when the digitised data is read out from the digital store. Mass production of Ultra-high speed semiconductor ADC's can be technology-limited particularly when required to perform at a high accuracy (e.g. 8 Bit or better at digitising rates greater than 200 MHZ). These devices are therefore difficult to produce and hence expensive. This also applied to some extent to the digital store. An alternative approach is to use a Charge Coupled Device (CCD) for the conversion process. This component operates as a temporary analogue store, capturing the waveform in much the same way as would be done conceptually by a number of sample and hold circuits. The captured analogue waveform can then be read out from the CCD much more slowly into a low cost ADC and store system. The CCD therefor has a useful property in that it can accurately capture the value of an analogue waveform. Intrinsically, the CCD is not capable of being clocked at particularly high speeds mainly due to limitations in the MOS process. However, high clocking rates can be achieved by time-multiplexing a number of CCD lines. Matching between these lines can be kept to reasonable tolerances provided that they are integrated on a common semiconductor substrate. The difficulty which arises is that this matching is by no means perfect.

It is the object of this invention to describe a means by which the timing accuracy of each of the multiplexed lines can be accurately measured and corrected by using a software technique.

The present invention provides a method of calibrating devices used in a high speed sampling apparatus, comprising the steps of applying respective clock signals to each of a plurality of time multiplexed devices, applying a timing reference signal to said multiplexed devices, comparing the results of the application of the two signals, and adjusting the timing of the respective clock signals whereby to calibrate the devices.

It is also of interest to note that this correction technique may also be applied to multiplexing slower speed ADC's in a similar way to achieve a similar result.

The present invention also provides a sampling apparatus comprising a clock signal generator, a plurality of devices each driven by a respective clock signal from said generator whereby to time multiplex said devices, variable delay means for selectively delaying the respective clock signals from the generator, means for supplying a reference timing signals to said devices, and means for adjusting the variable delay means in response to the application of said two signals whereby to calibrate said plurality of devices.

Preferably, the reference timing signal is derived from the clock signal generator but it may also be a separate ramp signal. Also, a microprocessor is used to control the variable delay means during the calibration procedure.

In order that the present invention be more clearly understood, an embodiment thereof will now be described by way of example with reference to the accompanying drawings, in which.

Figure 1:
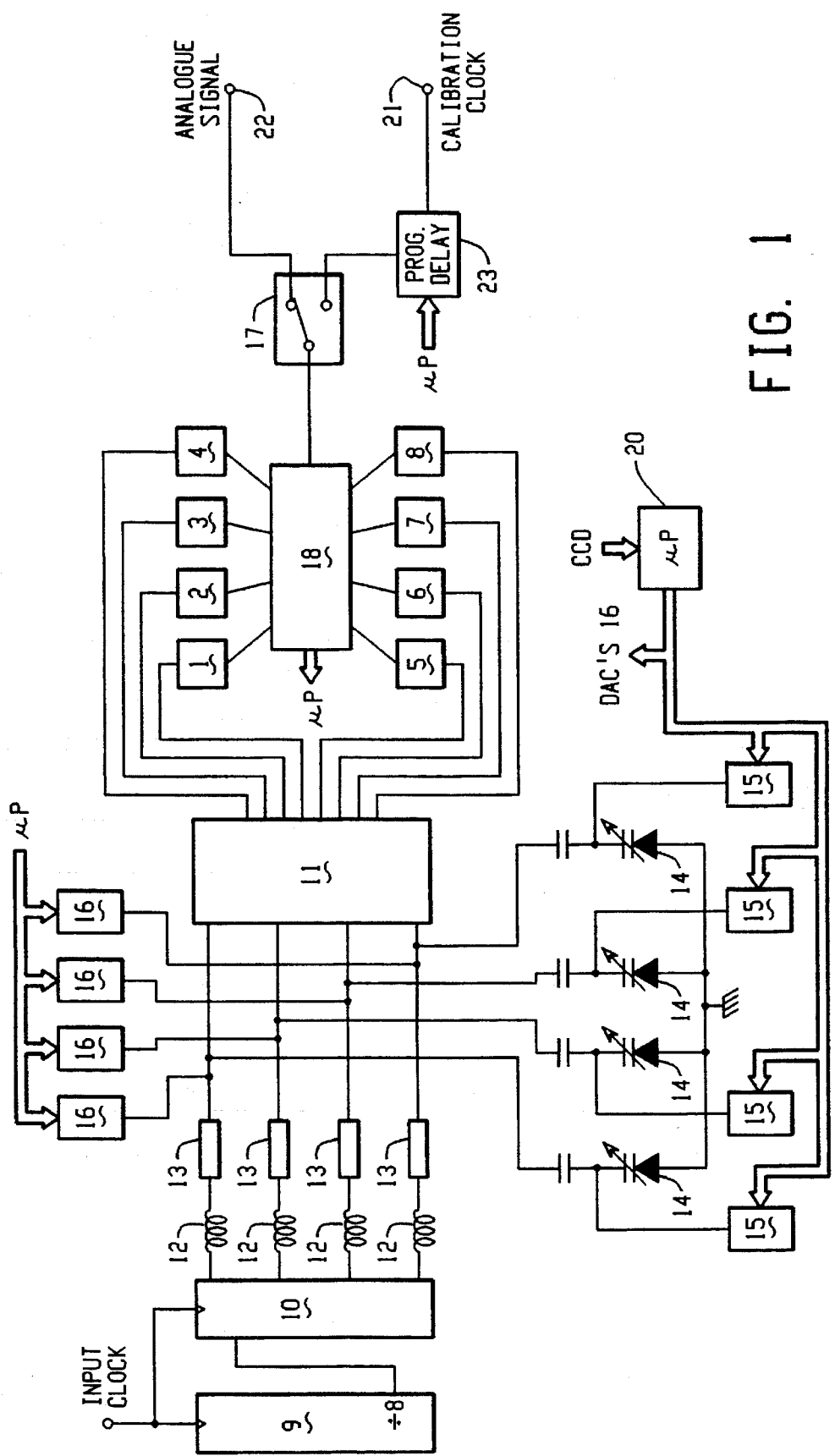
FIG. 1 shows a block diagram of a circuit according to an embodiment of the present invention.
Figure 3A:
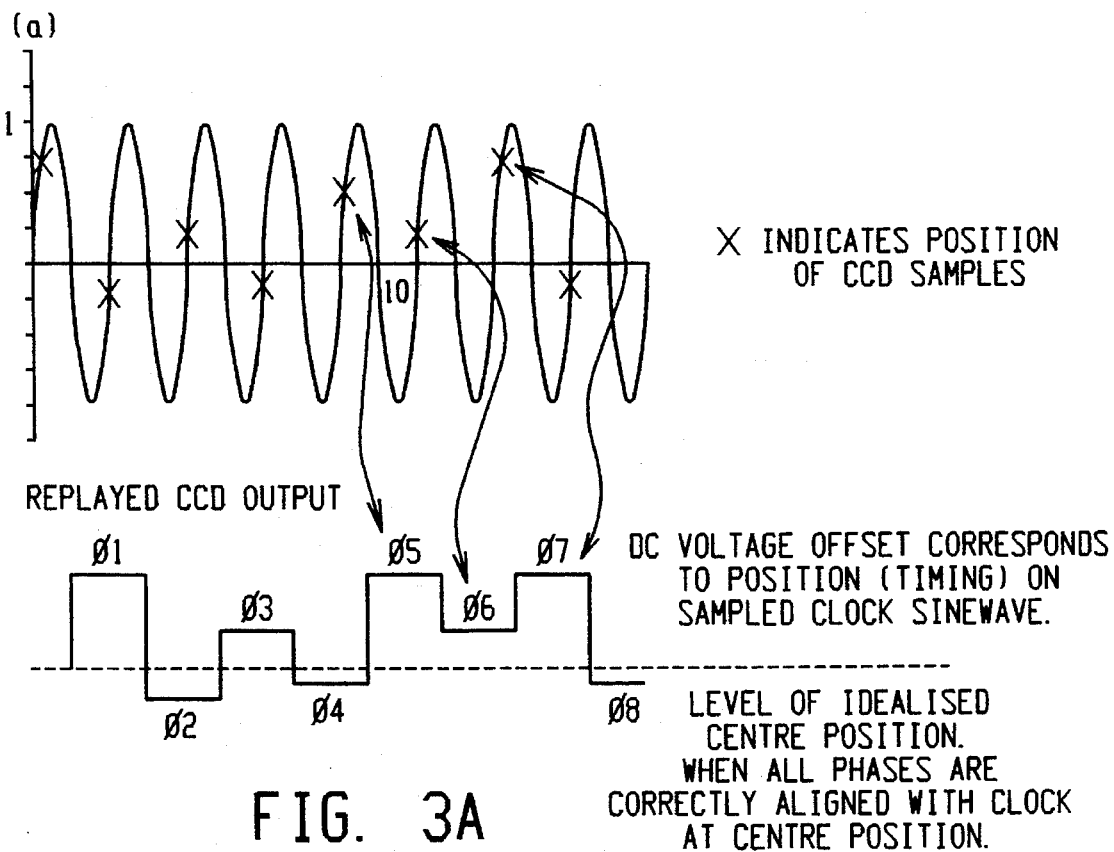
Figure 3B:
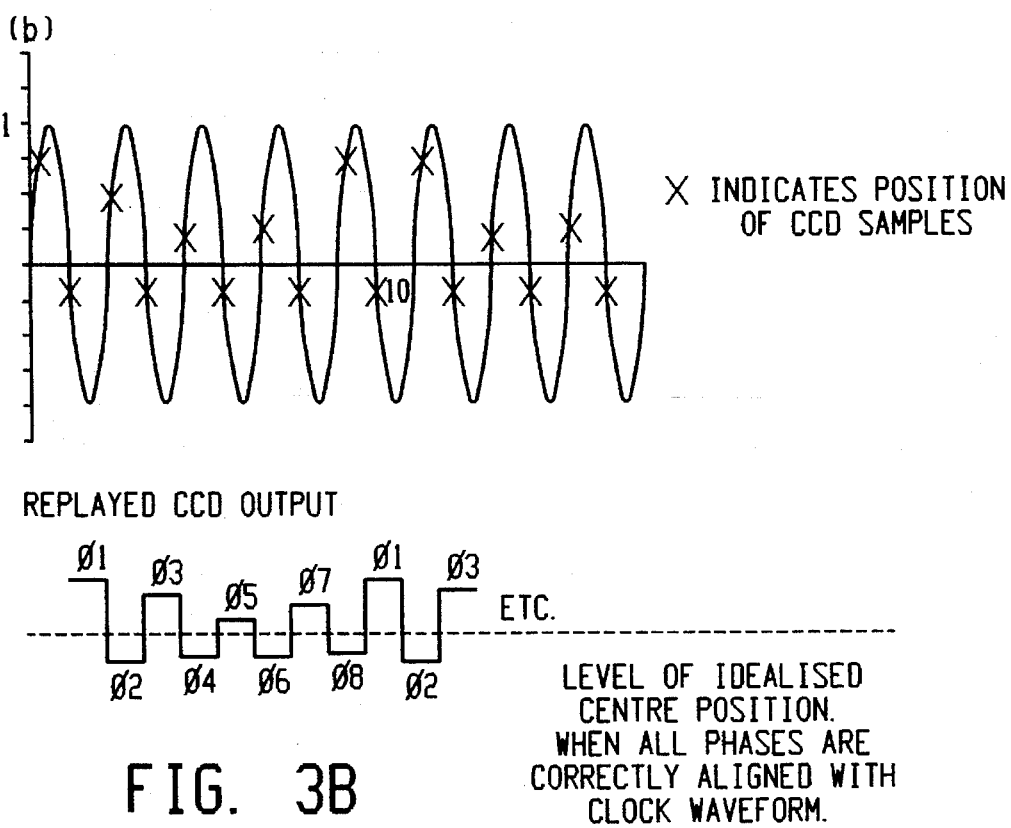

FIGS. 3(a) and 3(b) shows waveforms useful for explaining the operation of the circuit shown in FIG. 1.

Before discussing the preferred embodiment of the present invention, it is considered helpful if the problems of the prior arrangements were described.

As an example, the CCD consists of an 8 section device with each section clocked at frequencies up to 50 MHz in a multiplexed mode so that the upper effective clocking rate if 400 MHz (i.e. 8 * 50 MHz). Multiplexing CCD's is a method well known in the art for achieving higher clock rates than could otherwise be achieved by simply clocking a single line at a faster rate. The problem with multiplexing, however, is that there is an inherent matching accuracy between each of the multiplexed lines giving rise to errors which fall into the following categories:

1) DC offset mismatch
2) Gain mismatch
3) High speed sampling matching.

In the case of the first two error sources, the cause generally reduces to small mismatches within the capacitive elements which constitute the line. These can generally be compensated for by either analogue or digital means when the signals are read out at a speed slower than the sampling frequency from the CCD device. The high speed sampling error mismatch however need not necessarily be solely a function of the CCD but could also relate to any errors between the timing of the clocking system for the 8 phases. This error only manifests itself when a high analogue input frequency is fed into the CCD. For example, to capture a 100 MHz analogue input waveform to 8 bit accuracy, a maximum sampling uncertainty of 6pS must be achieved. This presents difficulties when a CCD is being set up manually due to problems such as:

a) drift
b) finding a true point of reference
c) time spent in setup and testing.

Turning now to the present invention, FIG. 1 shows the block diagram of a CCD data capture system. This consists of 8 clock drives (1 to 8) which supply sampling clocks to a CCD (18) as described above. These clocks are controlled by a counter (9), shift register (10) having a plurality, on this case four outputs and logic driver (11) which supplies 4 paraphase clocks to the clock drivers.

Connected in series with each output of the shift register (10) is a variable delay element which consists of a coil, (12) resistor (13) and varactor diode (14). (A plurality of these elements exists according to the number of multiplexed lines within the CCD). Each of these variable delay elements is under control of a microprocessor (20) using a respective digital to analogue converter (DAC) 15. This allows incremental adjustment to be made of the group delay on each paraphase pair of clock signals.

Figure 2:
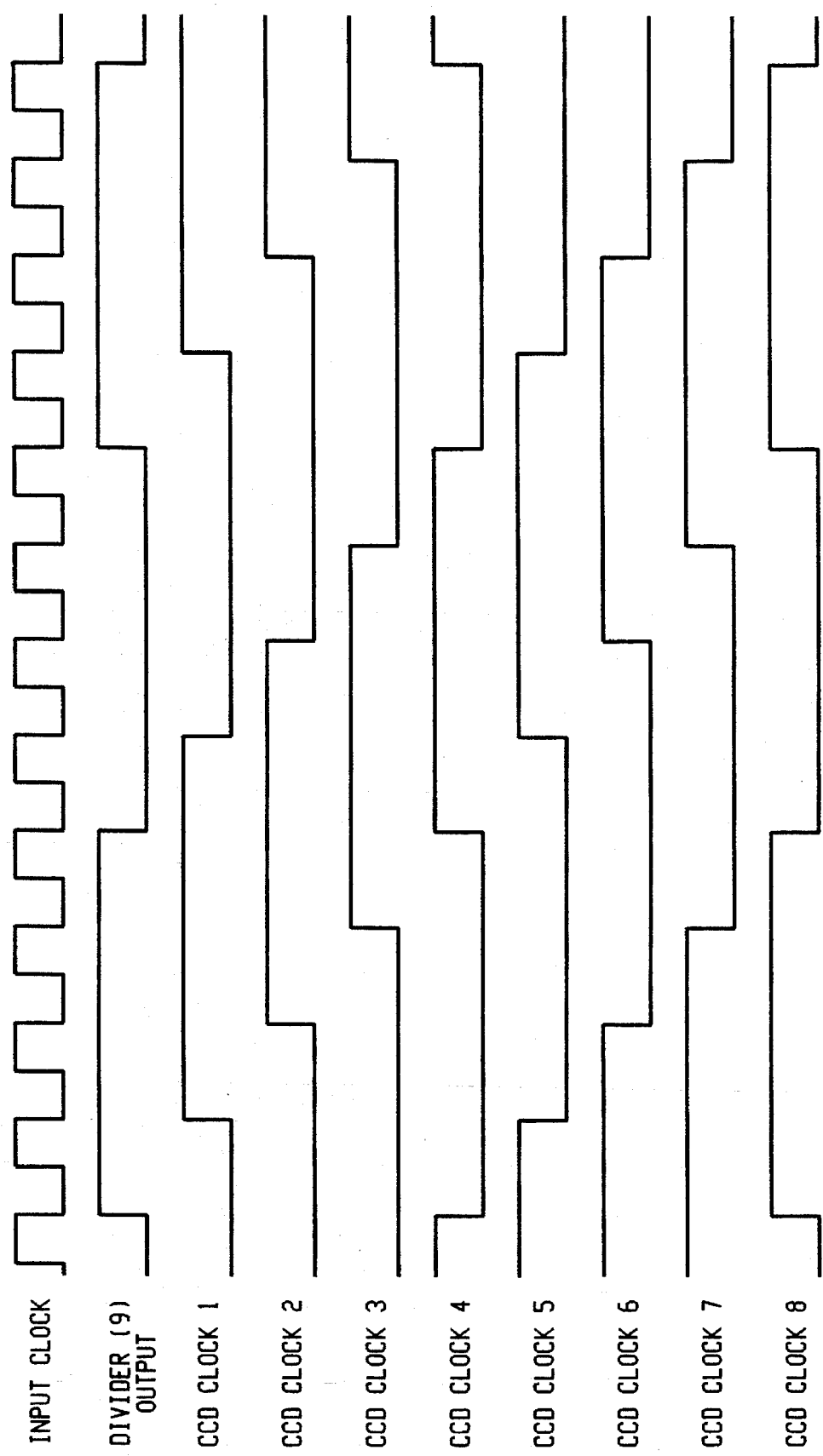
FIG. 2 shows timing waveforms for clocks used in FIG. 1.

FIG. 2 shows the waveforms of the paraphase clocks to the clock drivers (1 to 8). Waveform (a) shows the input clock signal which is divided by the circuit (9) to provide a pulse output as shown in waveform (b). The pulse output from the divider circuit (9) is successively delayed by each of the delay elements to derive the waveforms c–f which are fed to the clock drivers 1–4 of the CCD (18). The delay elements also produce the paraphase waveforms g–j which are fed to the clock drivers 5–8 of the CCD, the waveform g being the inverse of waveform c etc.

Secondly, it is necessary to incrementally adjust the mark to space ratio of the signals within the paraphase pair. Normally, because of the high clocking speeds involved here, emitter coupled logic (ECL) is used and the mark to space ratio can be conveniently adjusted by modifying the threshold potential applied to the logic. This is controlled by further DAC's (16), using the resistors (13) as the current to voltage control elements. Hence, by using a combination of the controls on the variable delay elements and the mark-space elements, the absolute timing on any individual CCD line can be controlled. This uniquely dictates the point at which each multiplexed element of the CCD line takes its sample. Hence by controlling the values of the signals sent to the DAC's (15) and (16) the position of the sampling edge can be accurately controlled. Uncalibrated sampling of a waveform is shown in FIG. 3a.

The DAC's (15) and (16) are controlled by a microprocessor (20) which processes sampled output data from the CCD (18) to produce correction signals for application to the DAC's (15) and/or (16) in a feedback loop control strategy which will now be described.

The feedback loop control strategy makes use of the input clock fed to the input counter (9) and shift register (10). It is assumed that the input clock to the system is pure and hence this is used as the reference signals. A portion of the clock signal is tapped off and fed via an input terminal (21) to the CCD analogue input during the calibration phase by switch (17). The CCD (18) then samples its own clock, and having previously removed the DC offset and gain errors as described in 1 and 2, the phase delay elements and mark-space control elements are adjusted for a straight line trace under the control of the microprocessor. When the clock signal is sampled by the CCD the slow speed replayed output will give a DC voltage proportional to the sampled signal level taken at the edge of its own clock. Ideally if all samples of the multiplexed line within the CCD are taken at the same signal level on the clock waveform then the replayed output from the CCD will be a straight line as indicated by the dotted line in FIG. 3a. Any difference in timing will show as an error voltage from this straight line and derived by the microprocessor which will control a suitable delay or mark-space ratio element to remove this error. Having used this clock signal as a sampling point calibration means, the clock signal is then removed from the CCD analogue input and replaced by the main signal path from input terminal (22) using the changeover switch (17), The DAC's (15) and (16) then retain the calibration values for delay and mark space ratio and the positional sampling accuracy is maintained.

It is possible to introduce a programmable delay device (23) between the input terminal (21) and the changeover switch (17), the delay device also being controlled by an output from the processor (20) whereby to facilitate calibration.

A variation of this method exists when the calibration clock runs at only half the value of the effective CCD clocking rate. Such is the case when the logic is speed limited and the multiplexed clocking to the CCD is provided by using delay line techniques. In this case the calibration clock must have an even mark to space ratio. This is conveniently done by filtering the clock into a sinusoid. In this case, the CCD is made to sample both edges of the clock signal, and the variable delay/mark space elements are adjusted so that the sinewave clock is sampled at its mid point. (See FIG. 3b).

A second variation of the calibration technique is by using an external ramp generator, synchronised to the sampling system to replace the sampling clock fed into the switch (17). This ramp generator must run at a high speed and travel its full amplitude in approximately the time taken for each of the multiplexed CCD lines to have acquired at least one sample. The replayed output from the CCD should then display a similar ramp for the samples taken, and calibration control can be applied to the delay and mark space ratio elements to correct for errors which differ from the expected DC position on this ramp.

It will be appreciated that the use of 8 clock drivers is for explanatory purposes only and the number of multiplexed lines and hence the number of clock drivers may be altered depending on the speed required of the circuitry.

The features of the above circuit are:

1) A calibration method for a multiplexed CCD or sample and hold circuits to set up the timing of the sampling clocks by using the system clock as a time reference.

2) A calibration method for a multiplexed CCD or sample and hold circuits to set up the timing position of the sampling clocks by using an analogue or digitally generated ramp as a reference.

3) a method of using a multiplexed CCD or sample and hold circuits to sample its clock signal as described in (2) above but where both edges of the clock signal are sampled.

4) A method using a combination of variable delay elements and/or mark-space ratio using digital or analogue control to accurately set the timing position of the sample clocks in a CCD.

When the above features are applied to correct a number of multiplexed Analogue to Digital converters, a high speed composite converter may be produced with accurately controlled timing.

When the above features are applied to correct a number of multiplexed Sample-and-Hold circuits, a composite higher speed Sample-and-Hold system may be produced with accurate timing.

I claim:

1. A method of calibrating a high speed sampling apparatus comprising the steps of applying respective clock signals to each of a plurality of time multiplexed sampling devices, applying a timing reference signal to said multiplexed devices, comparing the results of the application of the clock and reference signals, adjusting the timing of at least one of the respective clock signals whereby to calibrate the devices, and wherein the step of adjusting the timing of at least one of the respective clock signals comprises the step of adjusting the mark/space ratio of said at least one respective clock signal.

2. A method according to claim 1 wherein the timing reference signal is derived from the clock signals.

3. A method according to claim 1, wherein the timing reference signal is a ramp signal.

4. A method according to claim 1, wherein the step of adjusting the timing of at least one of the respective clock signals further comprises the step of adjusting the phase of said at least one respective clock signal.

5. A sampling apparatus comprising a clock signal generator, a plurality of sampling devices (18) driven by a respective clock signal from said generator whereby to time multiplex said devices, variable delay means (12, 13, 14) for selectively delaying the respective clock signals from the generator, means (21, 17) for supplying a reference timing signal to said devices (18), and means (20, 15) for adjusting at least one of the variable delay means (12, 13, 14) in response to the application of said clock and reference signals, wherein the adjusting means comprise a digital to analogue converter (15) connected to a varactor diode (14) forming part of the variable delay means.

6. A sampling apparatus comprising a clock signal generator, a plurality of sampling devices (18) driven by a respective clock signal from said generator whereby to time multiplex said devices, variable delay means (12, 13, 14) for selectively delaying the respective clock signals from the generator, means (21, 17) for supplying a reference timing signal to said devices (18), means for altering the mark-space ratio of the respective clock signals derived from the clock signal generator, and means (20, 15) for adjusting the variable delay means (12, 13, 14) and means for altering in response to the application of said clock and reference signals.

7. Apparatus according to claim 6, wherein the sampling devices are charge coupled devices.

\* \* \* \* \*